United States Patent
Mehta et al.

(10) Patent No.: US 10,670,680 B2
(45) Date of Patent: Jun. 2, 2020

(54) SYSTEM AND METHOD FOR MOTION INSENSITIVE MAGNETIC RESONANCE FINGERPRINTING

(71) Applicant: Case Western Reserve University, Cleveland, OH (US)

(72) Inventors: Bhairav Bipin Mehta, Cleveland, OH (US); Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 46 days.

(21) Appl. No.: 15/947,558

(22) Filed: Apr. 6, 2018

(65) Prior Publication Data

US 2018/0292497 A1     Oct. 11, 2018

Related U.S. Application Data

(60) Provisional application No. 62/482,349, filed on Apr. 6, 2017.

(51) Int. Cl.
| | |
|---|---|
| *G01V 3/00* | (2006.01) |
| *G01R 33/56* | (2006.01) |
| *G01R 33/48* | (2006.01) |
| *G01R 33/54* | (2006.01) |
| *G01R 33/565* | (2006.01) |
| *G01R 33/50* | (2006.01) |

(52) U.S. Cl.
CPC ..... *G01R 33/5608* (2013.01); *G01R 33/4828* (2013.01); *G01R 33/543* (2013.01); *G01R 33/56509* (2013.01); *G01R 33/50* (2013.01)

(58) Field of Classification Search
CPC .............. G01R 33/3415; G01R 33/543; G01R 33/5659; G01R 33/36; A61B 5/055
USPC ........................................................ 324/307
See application file for complete search history.

(56) References Cited

U.S. PATENT DOCUMENTS

| | | | |
|---|---|---|---|
| 8,723,518 B2 | 5/2014 | Seiberlich | |
| 2013/0303898 A1* | 11/2013 | Kinahan | A61B 6/527 600/425 |
| 2014/0266199 A1* | 9/2014 | Griswold | G01R 33/543 324/309 |
| 2015/0226537 A1* | 8/2015 | Schorre | A61B 5/6841 356/479 |
| 2015/0250446 A1* | 9/2015 | Kanayama | A61B 8/06 600/438 |
| 2015/0301141 A1 | 10/2015 | Griswold | |
| 2016/0003928 A1* | 1/2016 | Chen | G01R 33/5611 324/309 |

(Continued)

OTHER PUBLICATIONS

Jiang, Yun, et al. "MR fingerprinting using fast imaging with steady state precession (FISP) with spiral readout." Magnetic resonance in medicine 74.6 (2015): 1621-1631.

(Continued)

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

Methods for magnetic resonance fingerprinting ("MRF") that are more robust to patient motion than conventional MRF techniques are described. The methods described in the present disclosure provide an image reconstruction algorithm for MRF that decreases the motion sensitivity of MRF.

18 Claims, 2 Drawing Sheets

(56) References Cited

U.S. PATENT DOCUMENTS

2016/0005180 A1* 1/2016 Matono .................... G06T 7/11
  348/47
2017/0042496 A1* 2/2017 Shanbhag .............. A61B 5/055

OTHER PUBLICATIONS

Ma D., et al., in "Magnetic Resonance Fingerprinting," Nature, 2013; 495(7440):187-192.

Otsu, Nobuyuki. "A threshold selection method from gray-level histograms." IEEE transactions on systems, man, and cybernetics 9.1 (1979): 62-66.

* cited by examiner

SYSTEM AND METHOD FOR MOTION INSENSITIVE MAGNETIC RESONANCE FINGERPRINTING

CROSS-REFERENCE TO RELATED APPLICATIONS

The present application is based on, claims priority to, and incorporates herein by reference in its entirety for all purposes, U.S. Provisional Application Ser. No. 62/482,349, filed Apr. 6, 2017, and entitled "MOTION INSENSITIVE MAGNETIC RESONANCE FINGERPRINTING."

STATEMENT REGARDING FEDERALLY SPONSORED RESEARCH

This invention was made with government support under EB016728 and EB017219 awarded by the National Institutes of Health. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," Nature, 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

Patient motion is ubiquitous in clinical MRI, and in certain situations it is nearly unavoidable. For example, in patient populations such as the elderly, pediatrics, those who suffered a stroke, and so on, the data acquisition process is susceptible to patient motion and, thus, imaging is often performed under anesthesia. However, the use of anesthesia lengthens the scan duration or otherwise leads to a loss of valuable diagnostic or therapeutic information, thereby reducing the value of the exam.

MRF is generally less sensitive to subject motion than conventional imaging techniques. However, the reconstruction algorithms used for conventional implementations of MRF are still susceptible to patient motion, primarily patient motion occurring in the early stages of the acquisition. Thus, there remains a need to provide methods for MRF that are more robust to patient motion.

SUMMARY OF THE DISCLOSURE

The present disclosure addresses the aforementioned drawbacks by providing systems and methods for producing images of a subject with a magnetic resonance imaging ("MRI") system.

In accordance with one aspect of the disclosure, a method is provided that includes accessing magnetic resonance data with a computer system that was acquired from a subject using a series of variable sequence blocks to cause one or more resonant species in the subject to simultaneously produce individual magnetic resonance signals, and wherein least one member of the series of variable sequence blocks differs from at least one other member of the series of variable sequence blocks in at least two sequence block parameters. A series of initial image frames is generated with the computer system by comparing the magnetic resonance data to a dictionary of signal evolutions, and motion corrupted image frames in the series of initial image frames are identified using the computer system. Subject motion from the identified motion corrupted image frames is then estimated using the computer system. Motion-compensated magnetic resonance data are generated with the computer system by applying the estimated subject motion to the provided magnetic resonance data. A series of motion-compensated image frames is then produced with the computer system by comparing the motion-compensated magnetic resonance data to the dictionary of signal evolutions.

In accordance with another aspect of the disclosure, a system is provided that includes a magnet system configured to generate a polarizing magnetic field about at least a portion of a subject, a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals from the subject using a coil array. The system also includes a computer system programmed to control the magnetic gradient system and the RF system to acquire MRF data from a subject using a series of variable sequence blocks to cause one or more resonant species in the subject to simultaneously produce individual magnetic resonance signals and wherein at least one member of the series of variable sequence blocks differs from at least one other member of the series of variable sequence blocks in at least two sequence block parameters. The computer system is further programmed to generate a series of initial image frames by comparing the MRF data to a dictionary of signal evolutions, identify motion corrupted image frames in the series of initial image frames, and estimate subject motion from the identified motion corrupted image frames. The computer system is further programmed to produce motion-compensated data by applying the estimated subject motion to the MRF data and generate a series of motion-compensated image frames by comparing the motion-compensated data to the dictionary of signal evolutions.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
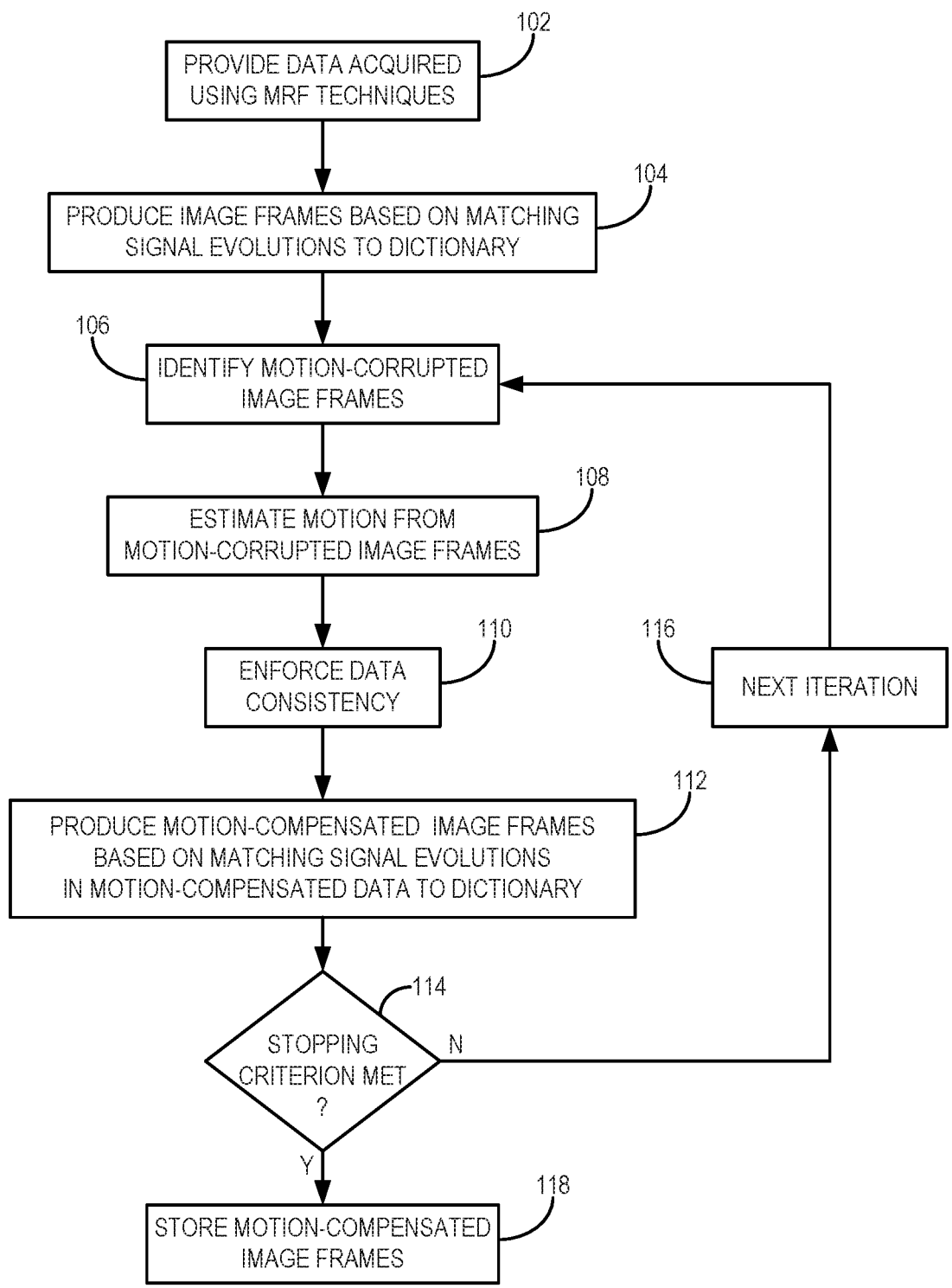
FIG. 1 is a flowchart setting forth the steps of an example method for motion insensitive magnetic resonance fingerprinting ("MORF").

Described here are methods for magnetic resonance fingerprinting ("MRF") that are more robust to patient motion than conventional MRF techniques. The methods described in the present disclosure provide an image reconstruction algorithm for MRF that decreases the motion sensitivity of MRF.

MRF is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1, T_2, D)$ is a signal decay due to relaxation differences; and $M_0$ is the magnetization in the default or natural alignment to which spins align when placed in the main magnetic field.

While $E_i(T_1, T_2, D)$ is provided as an example, in different situations, the decay term, $E_i(T_1, T_2, D)$, may also include additional terms, $E_i(T_1, T_2, D, K)$ or may include fewer terms, such as by not including the diffusion relaxation, as $E_i(T_1, T_2)$ or $E_i(T_1, T_2, K)$. Also, the summation on "j" could be replace by a product on "j".

The dictionary may store signals described by, $$S_i = R_i E_i (S_{i-1}); \quad (2)$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

As will be described, the present disclosure provides an MRF framework with an increased robustness towards patient motion. In general, implementations of MRF can still be susceptible to patient motion, primarily to patient motion occurring in the early stages of the acquisition. The methods described in the present disclosure provide an image reconstruction algorithm for MRF that decreases the motion sensitivity of MRF.

The general flow of the reconstruction algorithms described in the present disclosure, which may be referred to as MOtion insensitive magnetic Resonance Fingerprinting ("MORF"), is as follows.

Referring now to FIG. 1, a flowchart is illustrated as setting forth the steps of an example method implementing the MORF algorithms described in the present disclosure. Data acquired with an MRI system using an MRF technique are provided to a computer system, as indicated at step 102. Providing such data may include retrieving previously acquired data from storage, or can include acquiring such data using an MRI system.

As described above, data acquired with an MRF technique generally includes data containing random measurements, pseudorandom measurements, or measurements obtained in a manner that results in spatially incoherent signals, temporal incoherent signals, or spatiotemporally incoherent signals. For instance, such data can be acquired by varying acquisition parameters from one TR period to the next, which creates a time series of signals with varying contrast. Using this series of varied sequence blocks simultaneously produces different signal evolutions in different resonant species to which RF energy is applied.

As an example, data are acquired using a pulse sequence where effectuating the pulse sequence includes controlling an NMR apparatus (e.g., an MRI system) to apply RF energy to a volume in an object being imaged. The volume may contain one or more resonant species, such as tissue, fat, water, hydrogen, and prosthetics.

The RF energy may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. Depending upon the imaging or clinical need, two, three, four, or more parameters may vary between sequence blocks. The number of parameters varied between sequence blocks may itself vary. For example, a first sequence block may differ from a second sequence block in five parameters, the second sequence block may differ from a third sequence block in four parameters (or even more, such as seven, parameters). The third sequence block may differ from a fourth sequence block in two parameters, and so on. One skilled in the art will appreciate that there are a very-large number of series of sequence blocks that can be created by varying this large number of parameters. A series of sequence blocks can be crafted so that the series have different amounts (e.g., 1%, 2%, 5%, 10%, 50%, 99%, 100%) of unique sequence blocks as defined by their varied parameters. A series of sequence blocks may include more than ten, more than one hundred, more than one thousand, more than ten thousand, and more than one hundred thousand sequence blocks. In one example, the only difference between consecutive sequence blocks may be the number or parameters of excitation pulses.

Regardless of the particular imaging parameters that are varied or the number or type of sequence blocks, the RF energy applied during a sequence block is configured to cause different individual resonant species to simultaneously produce individual NMR signals. Unlike conventional imaging techniques, in an MRF pulse sequence, at least one member of the series of variable sequence blocks will differ from at least one other member of the series of variable sequence blocks in at least N sequence block parameters, where N is an integer greater than one. One skilled in the art will appreciate that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct, and thus more matchable, signal evolutions.

The pulse sequence used to acquire the provided data may apply members of the series of variable sequence blocks according to a partially random or pseudorandom acquisition plan configured to undersample the object at an undersampling rate, R. In different situations, the undersampling rate, R, may be, for example, two, four, or greater.

Unlike conventional MRI imaging processes, where the time during which an imaging-relevant NMR signal can be acquired is severely limited (e.g., 4-5 seconds), the NMR apparatus can be controlled to acquire NMR signal for significantly longer periods of time. For example, the NMR apparatus can be controlled to acquire signal for up to ten seconds, for up to twenty seconds, for up to one hundred seconds, or longer. NMR signals can be acquired for longer periods of time because signal information content remains viable for longer periods of time in response to the series of varied RF energy applied. In different situations, the information content in the signal evolution may remain above an information content threshold for at least five seconds, for at least ten seconds, for at least sixty seconds, or for longer. An information content threshold may describe, for example, the degree to which a subsequent signal acquisition includes information that can be retrieved and that differs from information acquired in a previous signal acquisition. For example, a signal that has no retrievable information would likely fall below an information content threshold while a signal with retrievable information that differs from information retrieved from a previous signal would likely be above the information content threshold.

Referring still to FIG. 1, image frames are then generated by matching signal evolutions in the provided data to a dictionary, as indicated at step 104. As described above, a pattern recognition algorithm, such as a template matching, can be implemented for this step. Comparing the signal evolutions in the acquired data to one or more known, stored, simulated, and/or predicted signal evolutions stored in the dictionary can be done in a variety of fashions. For example, the "stored" signal evolutions may include previously acquired signals, simulated signals, or both. In some configurations, the stored signal evolutions may be associated with signals not acquired from the object, while in another situation the stored signal evolutions may be associated with signals acquired from the object. In one configuration, the stored signals may be associated with signals acquired from the object being analyzed and signals not acquired from the object being analyzed. The generated images may include, for example, parameter maps such as T1 maps, T2 maps, and the like.

Motion corrupted image frames are then identified in the generated images, as indicated at step 106. These motion corrupted image frames can be identified based on metrics computed from the generated image frames. As one non-limiting example, the motion corrupted images can be identified based on normalized mutual information between different parameter maps (e.g., T1 maps, T2 maps) and images reconstructed from the acquired data (i.e., images not generated using template matching to a dictionary). As another non-limiting example, the motion corrupted images can be identified based on an RMSE between data before and after template matching to a dictionary.

For each of these metrics, the entire set of image frames can be divided into a number of sections (e.g., two sections) using a threshold estimation. As one example, the threshold estimation can implement Otsu's method. The section with a lower number of image frames can be selected as a motion corrupted image frame. The union of all of the motion corrupted image frames are used for motion estimation.

Motion estimation is then performed based on the identified motion corrupted image frames, as indicated at step 108. The estimation of the rigid-body motion can be performed using image registration between low-resolution estimates of each image frame with the corresponding image frames output from the pattern recognition step as a reference. A low-resolution estimate of each image frame can be generated in each iteration by applying a filter or window function to motion-compensated k-space measurements from the previous iteration, or to the original k-space data for the initial iteration. For instance, a radially symmetric Hanning window kernel can be applied to k-space data that has been motion-compensated based on motion estimates from previous iterations. As one example, a radially symmetric Hanning window kernel with windowing kernel parameters of an accept band=10%, a transition band=10%, and a stop band=80% can be used. Additionally, view-sharing can be used to further mitigate undersampling artifacts. As an example, view-sharing with a window size of three can be implemented.

After the motion estimation step, data consistency is performed as indicated at step 110. In one non-limiting example, data consistency is performed using the following equation:

$$m^* = m + F_u R^{-1} d - F_u F_u^{-1} m; \quad (3)$$

where m is the input frames, R is the motion registration operator, d is the measured k-space data, and $F_u$ is the undersampled nuFFT operator combined with a coil combination operator.

Based on the now motion-compensated data, a series of motion-compensated image frames is produced by matching signal evolutions in the motion-compensated data to a dictionary, as indicated at step 112. As described above, a pattern recognition algorithm, such as a template matching, can be implemented for this step. The generated images may include, for example, parameter maps such as T1 maps, T2 maps, and the like.

A determination is then made at decision block 114 whether a stopping criterion is satisfied. As one example, the stopping criterion may be, $$\frac{\|\text{update}(:)\|_2}{\|\text{current image estimate}(:)\|_2} < \text{threshold.} \quad (4)$$

While the stopping criterion is not satisfied, the method repeats to a next iteration starting with a pattern recognition based projection of the now motion-compensated image frames, as indicated at step 116. When the stopping criterion is satisfied, the motion-compensated image frames are stored for later use or display to a user, as indicated at step 118.

In an example study, an evaluation of the MORF algorithm described in the present disclosure was performed by simulating motion in a fully sampled in vivo brain data without motion, acquired using a FISP based MRF acquisition. The following types of motion were simulated during the beginning of the MRF acquisition (210 out of 1000 frames corrupted): tilt motion, where the head position started at 45 degrees and in the middle of the scan the head rotated to a position at zero degrees; and nodding motion, where continuous head rotation along the left-right direction with a max rotation of ±15 degrees. The motion corrupted data were undersampled (spirals=1; R=48) to estimate the k-space measurements. A dual-density spiral trajectory (FOV=300×300 mm$^2$ and matrix=256×256) with a density of 2 and 48 arms was used in this study. Additionally, prospectively motion corrupted MRF data were acquired from a healthy volunteer for evaluation of the MORF algorithm. The subject was requested to move back and forth in the left-right direction in the initial approximately 3 seconds of a 13.5 second FISP based MRF acquisition.

In the example study, MORF results were close to ground truth and presented minimal errors. MORF results showed effective suppression of motion artifacts and closely resembled the results from data without motion.

The MORF reconstruction algorithm described in the present disclosure thus noticeably decreased the sensitivity of MRF to subject motion; thereby reducing the loss of diagnostic and therapeutic information, the need for anesthesia, and the length of the procedure, which in turn improves the value of the imaging study.

Figure 2:
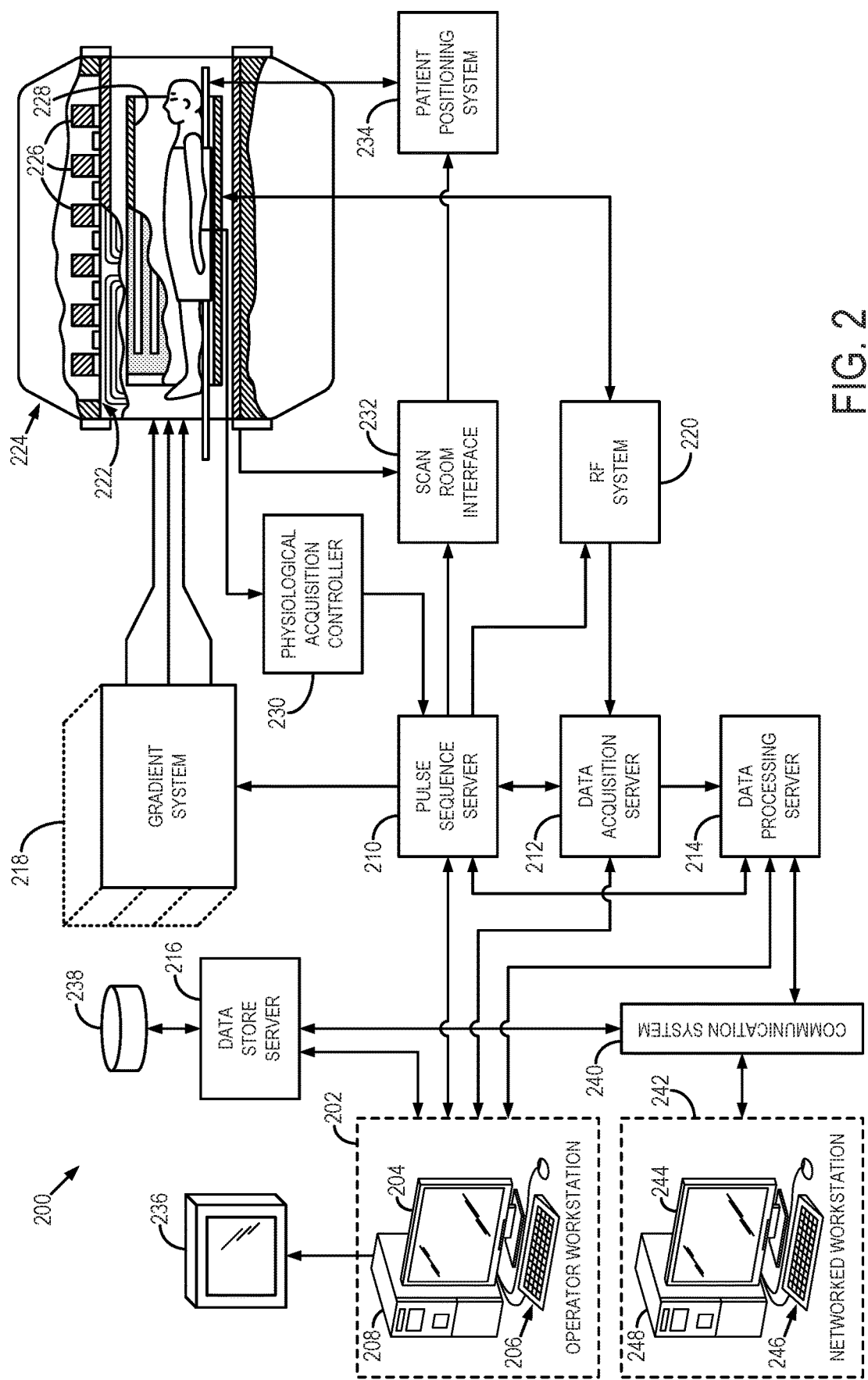
FIG. 2 is a block diagram of an example magnetic resonance imaging ("MRI") system that can implement the methods described in the present disclosure.

Referring particularly now to FIG. 2, an example of an MRI system 200 that can implement the methods described here is illustrated. The MRI system 200 includes an operator workstation 202 that may include a display 204, one or more input devices 206 (e.g., a keyboard, a mouse), and a processor 208. The processor 208 may include a commercially available programmable machine running a commercially available operating system. The operator workstation 202 provides an operator interface that facilitates entering scan parameters into the MRI system 200. The operator workstation 202 may be coupled to different servers, including, for example, a pulse sequence server 210, a data acquisition server 212, a data processing server 214, and a data store server 216. The operator workstation 202 and the servers 210, 212, 214, and 216 may be connected via a communication system 240, which may include wired or wireless network connections.

The pulse sequence server 210 functions in response to instructions provided by the operator workstation 202 to operate a gradient system 218 and a radiofrequency ("RF") system 220. Gradient waveforms for performing a prescribed scan are produced and applied to the gradient system 218, which then excites gradient coils in an assembly 222 to produce the magnetic field gradients $G_x$, $G_y$, and $G_z$ that are used for spatially encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil to perform the prescribed magnetic resonance pulse sequence. Responsive magnetic resonance signals detected by the RF coil 228, or a separate local coil, are received by the RF system 220. The responsive magnetic resonance signals may be amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the prescribed scan and direction from the pulse sequence server 210 to produce RF pulses of the desired frequency, phase, and pulse amplitude waveform. The generated RF pulses may be applied to the whole-body RF coil 228 or to one or more local coils or coil arrays.

The RF system 220 also includes one or more RF receiver channels. An RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2}; \quad (5)$$

and the phase of the received magnetic resonance signal may also be determined according to the following relationship:

$$\varphi = \tan^{-1}\left(\frac{Q}{I}\right). \quad (6)$$

The pulse sequence server 210 may receive patient data from a physiological acquisition controller 230. By way of example, the physiological acquisition controller 230 may receive signals from a number of different sensors connected to the patient, including electrocardiograph ("ECG") signals from electrodes, or respiratory signals from a respiratory bellows or other respiratory monitoring devices. These signals may be used by the pulse sequence server 210 to synchronize, or "gate," the performance of the scan with the subject's heart beat or respiration.

The pulse sequence server 210 may also connect to a scan room interface circuit 232 that receives signals from various sensors associated with the condition of the patient and the magnet system. Through the scan room interface circuit 232, a patient positioning system 234 can receive commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, so that data is not lost by data overrun. In some scans, the data acquisition server 212 passes the acquired magnetic resonance data to the data processor server 214. In scans that require information derived from acquired magnetic resonance data to control the further performance of the scan, the data acquisition server 212 may be programmed to produce such information and convey it to the pulse sequence server 210. For example, during pre-scans, magnetic resonance data may be acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also process magnetic resonance signals used to detect the arrival of a contrast agent in a magnetic resonance angiography ("MRA") scan. For example, the data acquisition server 212 may acquire magnetic resonance data and processes it in real-time to produce information that is used to control the scan.

The data processing server 214 receives magnetic resonance data from the data acquisition server 212 and processes the magnetic resonance data in accordance with instructions provided by the operator workstation 202. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 214 are conveyed back to the operator workstation 202 for storage. Real-time images may be stored in a data base memory cache, from which they may be output to operator display 202 or a display 236. Batch mode images or selected real time images may be stored in a host database on disc storage 238. When such images have been reconstructed and transferred to storage, the data processing server 214 may notify the data store server 216 on the operator workstation 202. The operator workstation 202 may be used by an operator to archive the images, produce films, or send the images via a network to other facilities.

The MRI system 200 may also include one or more networked workstations 242. For example, a networked workstation 242 may include a display 244, one or more input devices 246 (e.g., a keyboard, a mouse), and a processor 248. The networked workstation 242 may be located within the same facility as the operator workstation 202, or in a different facility, such as a different healthcare institution or clinic.

The networked workstation 242 may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may be exchanged between the data processing server 214 or the data store server 216 and the networked workstations 242, such that the data or images may be remotely processed by a networked workstation 242.

The present disclosure has described one or more preferred embodiments, and it should be appreciated that many equivalents, alternatives, variations, and modifications, aside from those expressly stated, are possible and within the scope of the invention.

The invention claimed is:

1. A method for producing images of a subject with a magnetic resonance imaging (MRI) system, the steps of the methods comprising:
   (a) providing magnetic resonance data to a computer system, wherein the magnetic resonance data were acquired from a subject with an MRI system by acquiring the magnetic resonance data in a series of variable sequence blocks to cause one or more resonant species in the subject to simultaneously produce individual magnetic resonance signals and wherein at least one member of the series of variable sequence blocks differs from at least one other member of the series of variable sequence blocks in at least two sequence block parameters;
   (b) generating a series of initial image frames with the computer system by comparing the magnetic resonance data to a dictionary of signal evolutions;
   (c) identifying motion corrupted image frames in the series of initial image frames using the computer system by computing metrics using the series of initial image frames and identifying the motion-corrupted image frames based on the computed metrics, wherein computing the metrics includes computing a comparison between the series of initial image frames and images reconstructed from the provided data;
   (d) estimating subject motion from the identified motion corrupted image frames using the computer system;
   (e) producing motion-compensated magnetic resonance data with the computer system by applying the estimated subject motion to the provided magnetic resonance data; and
   (f) generating a series of motion-compensated image frames with the computer system by comparing the motion-compensated magnetic resonance data to the dictionary of signal evolutions.

2. A system comprising:
   a magnet system configured to generate a polarizing magnetic field about at least a portion of a subject;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array;
   a computer system programmed to:
      control the magnetic gradient system and the RF system to acquire MRF data from a subject using a series of variable sequence blocks to cause one or more resonant species in the subject to simultaneously produce individual magnetic resonance signals and wherein at least one member of the series of variable sequence blocks differs from at least one other member of the series of variable sequence blocks in at least two sequence block parameters;
      generate a series of initial image frames by comparing the MRF data to a dictionary of signal evolutions;
      identify motion corrupted image frames in the series of initial image frames bar computing metrics by comparing the series of initial image frames and images reconstructed from the MRF data and using the series of initial image frames to identify the motion-corrupted image frames based on the metrics;
      estimate subject motion from the identified motion corrupted image frames;
      produce motion-compensated data by applying the estimated subject motion to the MRF data; and
      generate a series of motion-compensated image frames by comparing the motion-compensated data to the dictionary of signal evolutions.

3. The method as recited in claim 1, wherein the comparison comprises normalized mutual information.

4. The method as recited in claim 1, wherein the comparison comprises a root mean square error.

5. The method as recited in claim 1, wherein identifying the motion-corrupted image frames based on the computed metrics includes applying a threshold relative to the computed metrics from the initial series of image frames and selecting the motion-corrupted image frames based on the thresholding.

6. The method as recited in claim 5, wherein applying the threshold includes dividing the initial series of image frames into a number of sections using a threshold estimation.

7. The method as recited in claim 6, wherein the threshold estimation includes Otsu's method.

8. The method as recited in claim 6, wherein the motion-corrupted image frames are selected as those image frames in the section with a lowest number of image frames.

9. The method as recited in claim 1, wherein step (d) includes estimating the subject motion based on an image registration between a lower-resolution estimate of each given image frame in the motion-corrupted image frames and a corresponding motion-corrupted image frame.

10. The method as recited in claim 9, wherein the lower-resolution estimate of a given image frame is produced by filtering the magnetic resonance data associated with the given image frame and reconstructing the lower-resolution estimate of the given image frame from the filtered data.

11. The method as recited in claim 10, wherein the data are filtered using a radially symmetric Hanning window.

12. The method as recited in claim 1, wherein step (e) includes applying the estimated subject motion to the provided magnetic resonance data while enforcing a data consistency condition.

13. The method as recited in claim 12, wherein the data consistency condition is, $$m^* = m + F_u R^{-1} d - F_u F_u^{-1} m;$$

wherein m is the series of initial image frames, R is a motion registration operator based on the estimated subject motion, d is the provided magnetic resonance data, and $F_u$ is an undersampled nuFFT operator combined with a coil combination operator.

14. The method as recited in claim 1, further comprising, when a stopping criterion is not satisfied, iteratively compensating the generated series of motion-compensated image frames by in each iteration:
  estimating subject motion from the identified motion corrupted image frames;
  producing updated motion-compensated magnetic resonance data by applying the estimated subject motion to the motion-compensated magnetic resonance data from a previous iteration; and
  updating the series of motion-compensated image frames by comparing the updated motion-compensated magnetic resonance data to the dictionary of signal evolutions.

15. The method as recited in claim 1, wherein step (b) includes comparing magnetic resonance data to a dictionary of signal evolutions to determine matching of the magnetic resonance data to signal evolutions in the dictionary and, then, generating the series of initial image frames using the signal evolutions that were matched.

16. The system as recited in claim 2, wherein the computer system is configured to identify the motion-corrupted image frames by applying a threshold relative to the metrics from the initial image frames and selecting the motion-corrupted image frames based on the thresholding.

17. The system as recited in claim 2, wherein the computer system is further programmed to estimate the subject motion based on an image registration between a lower-resolution estimate of each given image frame in the motion-corrupted image frames and a corresponding motion-corrupted image frame.

18. The system as recited in claim 17, wherein the lower-resolution estimate of a given image frame is produced by filtering the magnetic resonance data associated with the given image frame and reconstructing the lower-resolution estimate of the given image frame from the filtered data.

* * * * *